United States Patent
Kubota et al.

(10) Patent No.: US 9,470,554 B2
(45) Date of Patent: Oct. 18, 2016

(54) POSITION DETECTOR

(71) Applicant: DENSO CORPORATION, Kariya, Aichi-pref. (JP)

(72) Inventors: Takamitsu Kubota, Chiryu (JP); Akitoshi Mizutani, Okazaki (JP); Yoshiyuki Kono, Obu (JP)

(73) Assignee: DENSO CORPORATION, Kariya (JP)

( * ) Notice: Subject to any disclaimer, the term of this patent is extended or adjusted under 35 U.S.C. 154(b) by 726 days.

(21) Appl. No.: 13/953,074

(22) Filed: Jul. 29, 2013

(65) Prior Publication Data

US 2014/0039829 A1    Feb. 6, 2014

(30) Foreign Application Priority Data

Aug. 6, 2012  (JP) .................................. 2012-174234

(51) Int. Cl.

| | | |
|---|---|---|
| *G01R 33/02* | (2006.01) | |
| *G01D 5/12* | (2006.01) | |
| *G01D 21/00* | (2006.01) | |
| *G01D 18/00* | (2006.01) | |
| *G01B 7/00* | (2006.01) | |
| *G06F 17/40* | (2006.01) | |
| *G06F 19/00* | (2011.01) | |
| *G01D 5/14* | (2006.01) | |
| *G01D 3/036* | (2006.01) | |

(52) U.S. Cl.
CPC ............ *G01D 5/145* (2013.01); *G01D 3/0365* (2013.01); *G01D 5/12* (2013.01); *G01D 18/00* (2013.01); *G01R 33/02* (2013.01); *G01B 7/00* (2013.01); *G01D 21/00* (2013.01); *G06F 17/40* (2013.01); *G06F 19/00* (2013.01)

(58) Field of Classification Search
None
See application file for complete search history.

(56) References Cited

U.S. PATENT DOCUMENTS

| 6,104,187 | A | * | 8/2000 | Marx ...................... G01D 5/145 324/202 |
| 6,498,479 | B1 | | 12/2002 | Hamaoka et al. |
| 6,812,694 | B2 | * | 11/2004 | Uenoyama ............. G01D 5/147 324/207.22 |
| 2004/0189285 | A1 | * | 9/2004 | Uenoyama ............. G01D 5/147 324/207.12 |

* cited by examiner

*Primary Examiner* — Edward Cosimano
(74) *Attorney, Agent, or Firm* — Nixon & Vanderhye PC

(57) ABSTRACT

A position detector includes a Hall element that detects a magnetic flux density and a temperature detection element that detects the temperature of the Hall element. In a rotation angle calculation process, a temperature correction value a is calculated by substituting a detection temperature t of the temperature detection element and a reference maximum voltage $V_0$ at a reference temperature $t_0$ for $a=V_0 \times k(t-t_0)$. Next, a correction maximum voltage Vt is calculated by substituting the temperature correction value a for a temperature characteristic formula of $Vt=V_0+a$. Further, a rotation angle θ of a magnet relative to the Hall element is calculated by substituting an output voltage VH of the Hall element and the correction maximum voltage Vt for $\theta=\sin^{-1}(VH/Vt)$. Since the correction maximum voltage Vt is corrected according to the temperature, the rotation angle is accurately detected.

6 Claims, 4 Drawing Sheets

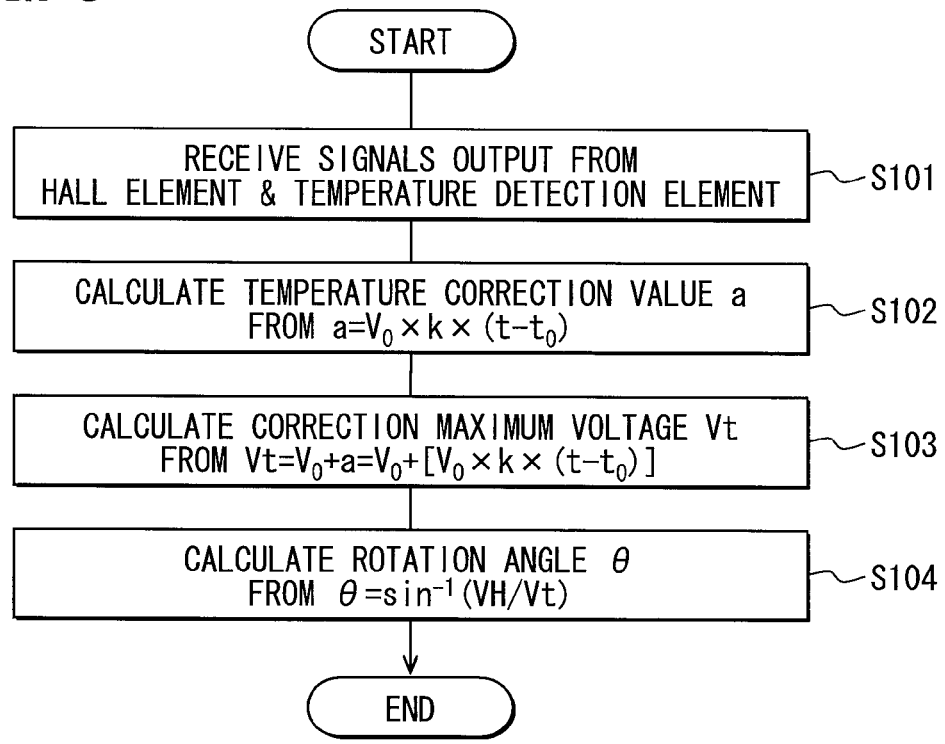
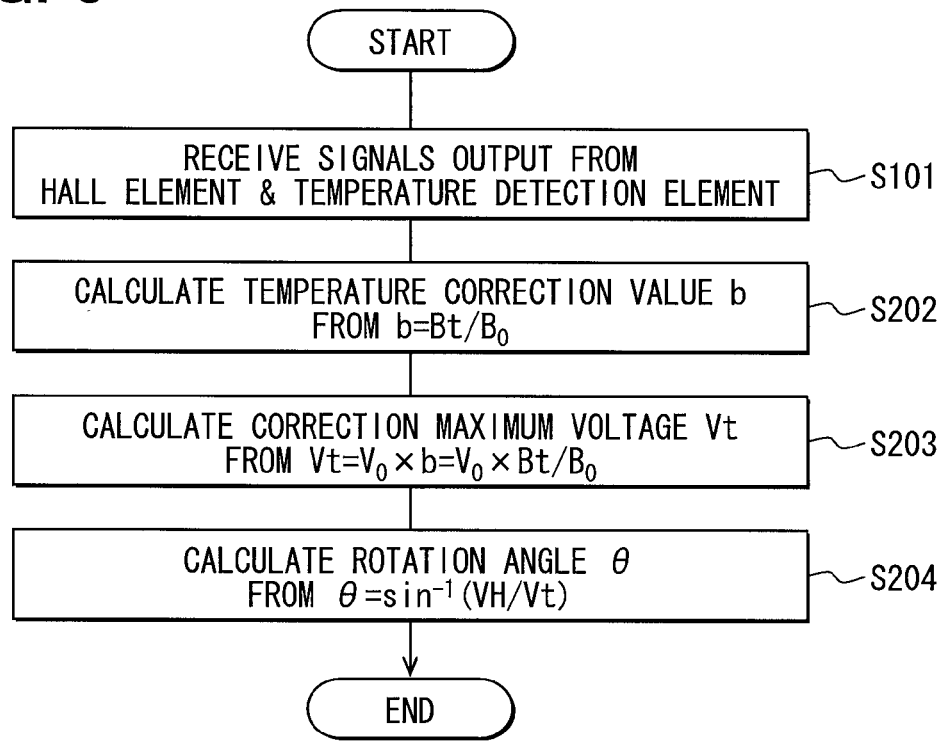

POSITION DETECTOR

CROSS REFERENCE TO RELATED APPLICATION

This application is based on Japanese Patent Application No. 2012-174234 filed on Aug. 6, 2012, the disclosure of which is incorporated herein by reference.

TECHNICAL FIELD

The present disclosure relates to a position detector.

BACKGROUND

A position detector that detects a rotation angle of a rotating object (detection object) has been known. In the known position detector, a magnetic field generation element, such as a magnet, or a magnetic field detection element, such as a Hall element, is disposed on the detection object. The magnetic field detection element detects a change in magnetic flux density when the detection object rotates, and the rotation angle of the detection object is calculated based on the change in the magnetic flux density detected.

For example, in a position detector of JP 3491577 B2, which corresponds to U.S. Pat. No. 6,498,479 B1, a magnet is disposed on a shaft as the detection object, and a rotation angle θ degree (°) of the shaft is detected based on the following formula 1:

$$\theta = \sin^{-1}(VH/V_0) \quad \text{(Formula 1)}$$

In the formula 1, VH is an output voltage (V) of the Hall element, and $V_0$ is a maximum voltage (V), that is, a maximum value of the output voltage of the Hall element.

In the position detector of JP 3491577 B2, however, the maximum voltage $V_0$ of the formula 1 is a fixed value. Therefore, when the density of the magnetic flux generated by the magnet changes due to an ambient temperature where the position detector is used, detection accuracy of the rotation angle calculated by the formula 1 is likely to reduce. Further, when the density of the magnetic flux increases with the change of the temperature, the output voltage VH will be greater than the maximum voltage $V_0$. In such a case, an inverse sine function of the expression 1 will not be calculated.

SUMMARY

It is an object of the present disclosure to provide a position detector with enhanced detection accuracy of a rotation angle.

According to an aspect of the present disclosure, a position detector includes a magnetic field generation element, a magnetic field detection element, a temperature detection element, a storage element and a rotation angle calculation element. The magnetic field detection element outputs a voltage according to a change in magnetic flux density caused when the magnetic field detection element rotates relative to the magnetic field generation element. The temperature detection element detects a temperature of the magnetic field generation element and outputs a voltage according to the temperature detected. The storage element stores a temperature characteristic formula and an output characteristic formula. The rotation angle calculation element calculates a rotation angle of the magnetic field generation element relative to the magnetic field detection element based on the temperature characteristic formula and the output characteristic formula.

The temperature characteristic formula represents a relationship between a reference maximum voltage, a temperature correction value and a correction maximum voltage Vt. The reference maximum voltage is a maximum value of the voltage outputted from the magnetic field detection element when the magnetic field generation element has a reference temperature. The temperature correction value is calculated based on the temperature detected by the temperature detection element. The correction maximum voltage Vt is calculated by correcting the reference maximum voltage with the temperature correction value. When the rotation angle of the magnetic field generation element relative to the magnetic field detection element is referred to as θ and the output voltage of the magnetic field detection element is referred to as VH, the output characteristic formula is expressed as $\theta = \sin^{-1}(VH/Vt)$.

In the position detector according to the above aspect, when the rotation angle of the magnetic field generation element relative to the magnetic field detection element is detected, the temperature of the magnetic field generation element is detected by the temperature detection element. The temperature correction value is calculated using the temperature characteristic formula stored in the storage element, and based on the temperature detected. Further, the correction maximum voltage Vt is calculated based on the temperature correction value calculated. The correction maximum voltage Vt calculated is substituted for the output characteristic formula, and the rotation angle θ is calculated based on the output voltage VH of the magnetic field detection element.

The density of magnetic flux generated by the magnetic field generation element changes with an ambient temperature. Considering this matter, the value of the correction maximum voltage Vt included in the output characteristic formula is changed according to the change of the magnetic flux density. Therefore, the rotation angle of the detection object can be accurately detected.

For example, the correction maximum voltage Vt is set to a value greater than the maximum voltage outputted from the magnetic field detection element at the ambient temperature. In such a case, the calculation of an inverse sine function of the output characteristic formula is enabled. Therefore, it is possible to detect the rotation angle of the detection object in a wide temperature range.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which:

FIG. 5 is a flowchart of a rotation angle calculation process performed by the position detector according to the first embodiment;

FIG. 6 is a flowchart of a rotation angle calculation process performed by a position detector according to a second embodiment.

DETAILED DESCRIPTION

Exemplary embodiments of the present disclosure will be described with reference to the drawings.

First Embodiment

A position detector according to a first embodiment of the present disclosure will be described with reference to FIGS. 1 to 5.

Figure 1:
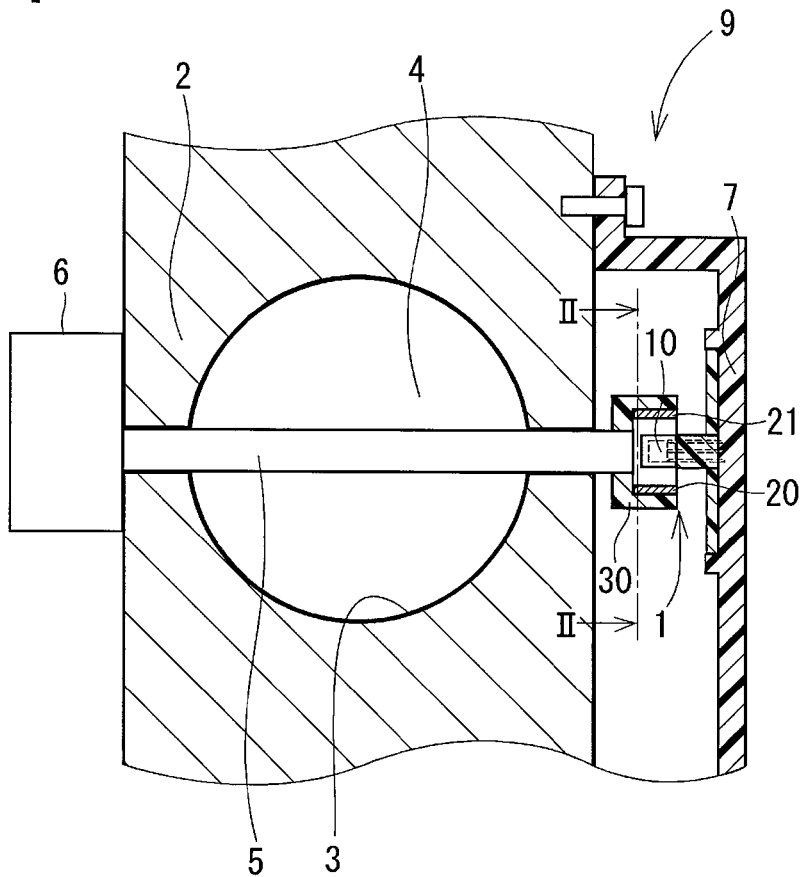
FIG. 1 is a diagram illustrating a cross-sectional view of an electronic control throttle to which a position detector according to a first embodiment of the present disclosure is employed.

As shown in FIG. 1, a position detector 1 according to the first embodiment is, for example, employed to an electronic control throttle 9 that controls the amount of air introduced to a cylinder of an internal combustion engine of a vehicle. A housing 2 of the electronic control throttle 9 has an intake air passage 3 through which the air introduced to the internal combustion engine flows. A throttle valve 4 having a substantially circular disc shape is disposed in the intake air passage 3. The throttle valve 4 is integral with a valve shaft 5. Both ends of the valve shaft 5 are rotatably supported by the housing 2. The throttle valve 4 is rotatable relative to the housing 2 while defining the valve shaft 5 as a rotation axis.

Figure 2:
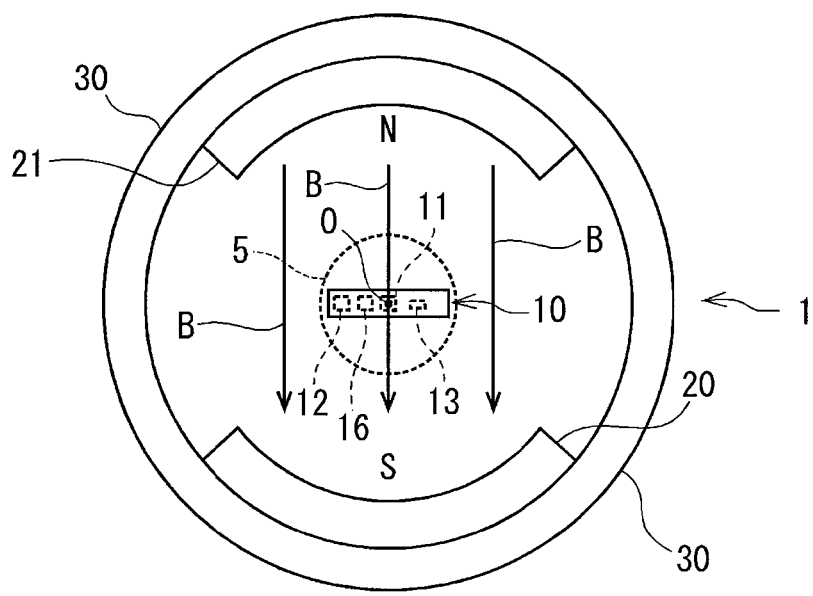
FIG. 2 is a diagram illustrating a schematic view of the position detector according to the first embodiment.

As shown in FIGS. 1 and 2, the position detector 1 includes permanent magnets 20, 21 and a Hall IC 10. The permanent magnets 20, 21 serve as a magnetic field generation element.

The permanent magnets 20, 21 are disposed adjacent to one end of the valve shaft 5 through a cylindrical yoke 30. The permanent magnets 20, 21 are disposed radially inside of the yoke 30 and at positions 180 degrees symmetric with respect to a rotation axis O of the yoke 30. As schematically shown by arrows B in FIG. 2, a magnetic flux flows in a direction substantially perpendicular to the rotation axis O of the yoke 30, between the two permanent magnets 20, 21.

The Hall IC 10 is fixed to a base 7 that is disposed on an outer wall of the housing 2. The Hall IC 10 is located adjacent to a substantially center of a line connecting the two permanent magnets 20, 21.

Figure 3:
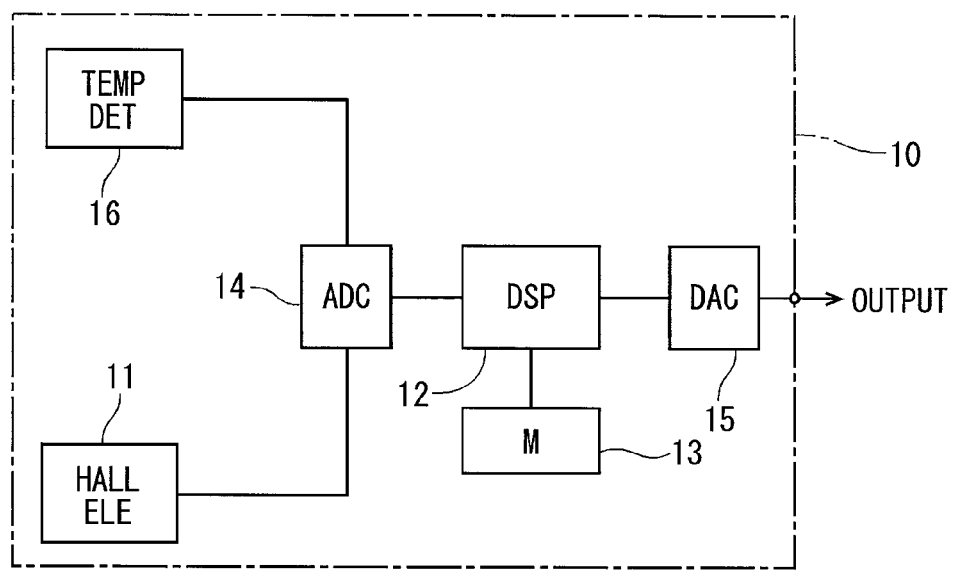
FIG. 3 is a circuit diagram of a Hall IC of the position detector according to the first embodiment.

As shown in FIG. 3, the Hall IC 10 is an integrated circuit (IC) chip having a Hall element 11, a temperature detection element 16, an analog-to-digital conversion (ADC) circuit 14, a digital signal processor (DSP) 12, a digital-to-analog conversion (DAC) circuit 15, and a memory 13. The Hall element 11 serves as a magnetic field detection element. The temperature detection element 16 serves as a temperature detection element. The DSP 12 serves as a rotation angle calculation element. The memory 13 serves as a storage element. The Hall IC 10 is disposed such that a magnetosensitive surface of the Hall element 11 is located on the rotation axis O of the yoke 30.

The Hall element 11 is provided by a semiconductor thin film. The Hall element 11 outputs an analog signal according to a change in density of the magnetic flux to the ADC circuit 14.

The temperature detection element 16 is, for example, provided by a diode thermometer. The temperature detection element 16 detects an ambient temperature of the position detector 1 based on a principle that an electric resistance of a diode changes with the temperature around the Hall IC 10. The temperature detection element 16 outputs an analog signal according to the detected temperature to the ADC circuit 14.

The ADC circuit 14 converts the analog signals outputted from the Hal element 11 and the temperature detection element 16 into digital signals. The DSP 12 performs a calculation process for calculating the rotation angle of the permanent magnets 20, 21 relative to the Hall element 11 based on the digital signals outputted from the ADC circuit 14. The DAC circuit 15 converts a digital signal processed by the DSP 12 into an analog signal, and outputs the analog signal to an external device.

For example, the memory 13 includes a read-only memory, and a writable and erasable memory. In the memory 13, a reference maximum voltage, a temperature correction value, a temperature characteristic formula, and an output characteristic formula are stored. The reference maximum voltage is a maximum value of a voltage outputted from the Hall element 11 when the temperature of the permanent magnets 20, 21 is at a reference temperature, which is predetermined. The temperature correction value is used for correcting the reference maximum voltage. The temperature correction value, the temperature characteristic formula, and the output characteristic formula will be described later in detail.

In the electronic control throttle 9, when the valve shaft 5 rotates, the permanent magnets 20, 21 rotate relative to the Hall element 11. The Hall IC 10 outputs a signal according to a magnitude of the density of the magnetic flux passing through the magnetosensitive surface of the Hall element 11 to an external device.

The throttle valve 4 is driven by a motor 6. The motor 6 is supplied with an electric current from an external electronic control unit (not shown) such that an opening degree of the throttle valve 4 calculated from the voltage of the outputted signal becomes a target opening degree that is set according to an operation condition of the internal combustion engine. Thus, the opening degree of the throttle valve 4 is controlled by the driving of the motor 6, so the amount of air supplied to the internal combustion engine is controlled.

Next, a rotational angle calculation process performed by the position detector 1 of the first embodiment will be described.

In the position detector 1, when the valve shaft 5 of the throttle valve 4 rotates, the yoke 30 rotates with the valve shaft 5. Because the direction of the magnetic flux generated by the permanent magnets 20, 21 changes with the rotation of the valve shaft 5, the value of an output voltage VH (V) that is outputted from the Hall element 11 and provided to the DSP 12 through the ADC 14 changes.

The DSP 12 calculates the rotation angle θ (°) by substituting the output voltage VH of the Hall element 11 for the output characteristic formula expressed by the formula 2 shown below. The DSP 12 outputs the calculated rotation angle θ (°) to the external device through the DAC circuit 15.

$$\theta = \sin^{-1}(VH/Vt) \quad \text{(Formula 2)}$$

In the formula 2, Vt is a correction maximum voltage (V). The correction maximum voltage Vt (V) is a formula of a temperature that is calculated beforehand by the DSP 12 when the rotation angle θ is calculated using the formula 2. The correction maximum voltage Vt changes with the ambient temperature where the position detector 1 is used, that is, the temperature of the permanent magnets 20, 21.

Figure 4:
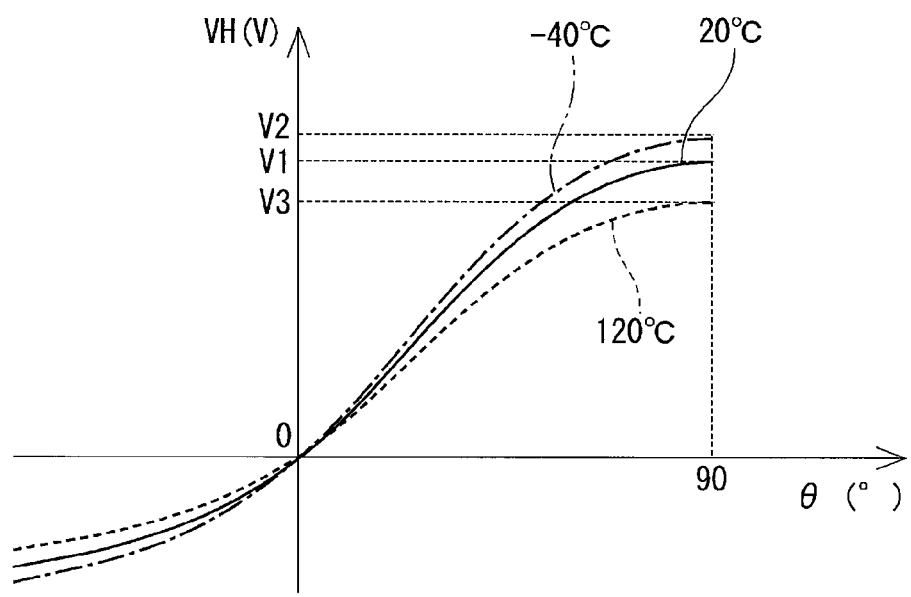
FIG. 4 is a graph illustrating a temperature characteristic of a voltage outputted from the Hall element according to the first embodiment.

FIG. 4 is a graph illustrating a relationship between the rotation angle θ and the output voltage VH of the Hall element 11, at different temperatures of the permanent magnets 20, 21. As shown in FIG. 4, the relationship between the rotation angle θ and the output voltage VH of the Hall element 11 has a sine curve. The output voltage VH is the maximum when the rotation angle θ is 90°. When the temperature of the permanent magnets 20, 21 is 20 degrees Celsius (° C.), the output voltage VH of the Hall element 11 at the rotation angle θ of 90° is defined as an output voltage V1. When the temperature of the permanent magnets 20, 21 is −40° C., the output voltage VH of the Hall element 11 at the rotation angle θ of 90° is an output voltage V2 that is greater than the output voltage V1. When the temperature of the permanent magnets 20, 21 is 120° C., the output voltage of the Hall element 11 at the rotation angle θ of 90° is an output voltage V3 that is smaller than the output voltage V1.

As described above, even when the rotation angle θ is the same, the output voltage VH of the Hall element 11 is different depending on the temperature of the permanent magnets 20, 21.

In the position detector 1 of the present embodiment, therefore, the rotation angle calculation process is performed in the following manner.

As shown in FIG. 5, at S101, the DSP 12 receives the signals outputted from the Hall element 11 and the temperature detection element 16 through the ADC circuit 14.

At S102, the temperature correction value a (V) is calculated from the following formula 3:

$$a = V_0 \times k \times (t - t_0) \quad \text{(Formula 3)}$$

In the formula 3, t is a detection temperature (° C.) calculated based on the signal outputted from the temperature detection element 16, $V_0$ is a reference maximum voltage (V) at a reference temperature $T_0$ (° C.), and k is a correction coefficient (V/° C.).

The correction coefficient k (V/° C.) is determined mainly based on a coefficient representing a temperature characteristic of a material of the permanent magnets 20, 21. The correction coefficient k (V/° C.) is a value indicating a rate of change of the voltage outputted from the Hall element 11 relative to the change of the temperature. The correction coefficient k (V/° C.) is stored in the memory 13.

At S103, the correction maximum voltage Vt (V), which is used to calculate the rotation angle θ at the detection temperature t, is calculated. In particular, the correction maximum voltage Vt is calculated using the temperature characteristic formula, which includes the temperature correction value a calculated at S102. The temperature characteristic formula is expressed by the following formula 4:

$$Vt = V_0 + a = V_0 + [V_0 \times k \times (t - t_0)] \quad \text{(Formula 4)}$$

At S104, the rotation angle θ of the permanent magnets 20, 21 relative to the Hall element 11 is calculated using the formula 2 for which the correction maximum voltage Vt calculated at S103 is substituted and based on the output voltage VH of the Hall element 11.

In the position detector 1 according to the first embodiment, the rotation angle θ is calculated considering that the output voltage VH of the Hall element 11 is changed due to the temperature. Prior to the calculation of the rotation angle θ, the correction maximum voltage Vt, which is necessary for the calculation of the rotation angle θ at the detection temperature t, is calculated based on the detection temperature t of the temperature detection element 16. The correction maximum voltage Vt is provided by adding a margin to the reference maximum voltage $V_0$. Even when the density of the magnetic flux generated by the permanent magnets 20, 21 increases due to the ambient temperature and the output voltage VH exceeds the reference maximum voltage $V_0$, the inverse sine function of the formula 2 can be calculated. Accordingly, the rotation angle θ can be calculated.

Also, in the position detector 1 according to the first embodiment, the correction maximum value Vt with respect to the output voltage VH of the Hall element 11 in the inversed sine function of the formula 2 is corrected for each detection temperature t. In this case, the correction coefficient k, which is used to calculate the correction maximum voltage Vt, can be suitably selected.

Therefore, the correction maximum voltage Vt can be calculated considering deformation of the yoke 30 due to the ambient temperature, the temperature characteristic of the Hall element 11 and the like, in addition to the influence by the temperature change in the density of the magnetic flux generated by the permanent magnets 20, 21. Accordingly, the rotation angle θ of the permanent magnets 20, 21 relative to the Hall element 21 can be accurately detected.

Second Embodiment

Figure 7A:
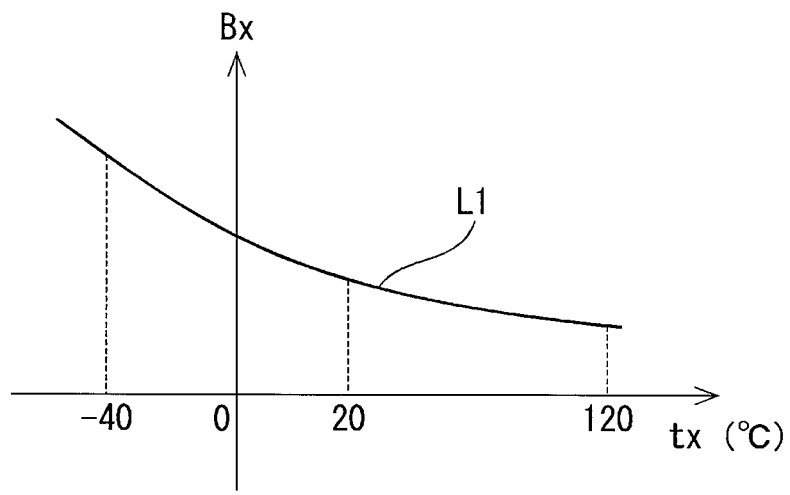
FIGS. 7A and 7B are graphs illustrating a relationship between a magnetic flux density generated and a temperature used in the rotation angle calculation process according to the second embodiment.

A position detector according to a second embodiment of the present disclosure will be described with reference to FIGS. 6, 7A and 7B.

In the second embodiment, the rotation angle θ is calculated in a different manner from the first embodiment. Hereinafter, components or elements substantially similar to the first embodiment will be designated with like reference numbers, and descriptions thereof will not be repeated.

FIG. 6 illustrates a flowchart of a rotation angle calculation process performed by the position detector 1 according to the second embodiment.

At S101, similar to the first embodiment, the DSP 12 receives the signals outputted from the Hall element 11 and the temperature detection element 16 through the ADC circuit 14.

At S202, a temperature correction value b is calculated from the following formula 5:

$$b = Bt/B_0 \quad \text{(Formula 5)}$$

In the formula 5, $B_0$ is a reference magnetic flux density (T), and Bt is a detection magnetic flux density (T). The temperature correction value b is a dimensionless number.

The reference magnetic flux density $B_0$ (T) is a density of the magnetic flux generated by the permanent magnets at a predetermined rotation angle when the temperature of the permanent magnets is at the reference temperature $t_0$. The detection magnetic flux density Bt (T) is a density of the magnetic flux generated by the permanent magnets at the predetermined rotation angle when the temperature of the permanent magnets is at the detection temperature t. The detection temperature is calculated based on the voltage signal outputted from the temperature detection element 16.

A method for calculating the temperature correction value b will be described with reference to FIGS. 7A and 7B.

Firstly, a magnetic flux density Bx generated by the permanent magnets is measured at plural temperatures tx. In FIG. 7A, in particular, the magnetic flux density Bx at the temperatures of −40° C., 20° C. and 120° C. are plotted, and a curve L1 is provided by connecting the measurement points. Next, the data of the magnetic flux densities Bx at the plural temperatures tx is normalized.

In particular, the reference temperature $t_0$ is set. A relational expression that can calculate the rate of the magnetic flux density Bx relative to the reference magnetic flux density $B_0$ is obtained by dividing the magnetic flux densities Bx at the temperatures other than the reference temperature $t_0$ by the reference magnetic flux density $B_0$ of the reference temperature $t_0$.

Figure 7B:
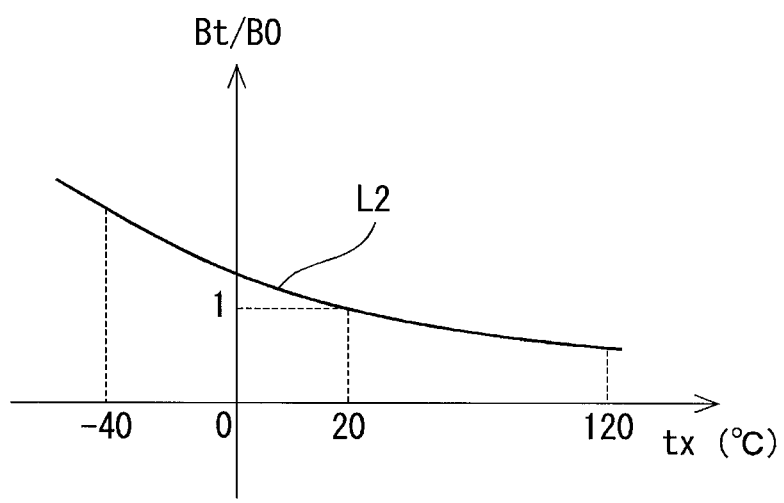

As shown in FIG. 7B, for example, when the reference temperature $t_0$ is set at 20° C., the magnetic flux density of the temperature of −40° C. is divided by the magnetic flux density of the temperature of 20° C. Likewise, the magnetic flux density of the temperature of 120° C. is divided by the magnetic flux density of the temperature of 20° C. As such, a solid line L2 is obtained based on the calculation results.

The solid line L2 denotes a ratio of the magnetic flux density of the temperature other than the reference temperature to the magnetic flux density of the reference temperature of 20° C. For example, the temperature correction value b can be expressed as the following formula 6 based on the shape of the solid line L2 of FIG. 7B:

$$b = 1 + \alpha \times (t-t_0) + \beta \times (t-t_0)^2 \quad \text{(Formula 6)}$$

In the formula 6, $\alpha$ and $\beta$ are arbitrary constant numbers.

At S203, the correction maximum voltage Vt (V), which is used for calculating the rotation angle θ at the detection temperature t, is calculated. In particular, the correction maximum voltage Vt is calculated using the temperature characteristic formula including the temperature correction value b calculated at S202. The temperature characteristic formula is expressed by the following formula 7:

$$\begin{aligned} Vt &= V_0 \times b & \text{(Formula 7)} \\ &= V_0 \times Bt/B0 \\ &= V_0 \times [1 + \alpha \times (t-t_0) + \beta \times (t-t_0)^2] \end{aligned}$$

At S204, the rotation angle θ of the permanent magnets 20, 21 relative to the Hall element 11 is calculated by the following formula 8 for which the correction maximum voltage Vt calculated at S203 is substituted, based on the output voltage VH of the Hall element 11.

$$\theta = \sin^{-1}(VH/Vt) \quad \text{(Formula 8)}$$

The formula 8 corresponds to the output characteristic formula.

In the position detector according to the second embodiment, the temperature correction value b is calculated based on the values of the magnetic flux density actually measured at the plural temperatures. The rotation angle θ of the permanent magnets 20, 21 relative to the Hall element 11 is calculated using the formula 8, which includes the correction maximum voltage Vt calculated using the temperature correction value b. Accordingly, the rotation angle θ can be accurately detected.

Other Embodiments (1) In the first embodiment, the temperature correction value for correcting the reference maximum temperature is a variable number that varies with the detection temperature, as shown in the formula 3. However, the temperature correction value may not be limited to the one described above. The temperature correction value may be a constant number that is predetermined.

(2) In the embodiments described above, the Hall element 11 is disposed on the fixed base 7, and the permanent magnets 20, 21 are rotated relative to the Hall element 11. Alternatively, the permanent magnets 20, 21 may be fixed, and the Hall element 11 may be rotated relative to the permanent magnets 20, 21.

(3) In the embodiments described above, the position detector 1 is exemplarily employed to the electronic control throttle. Further, the position detector 1 may be employed to any other device.

(4) In the embodiments described above, the Hall element 10 or the temperature detection element 16 is embedded in the Hall IC 11 fixed to the base 7. Arrangements of the Hall element 10 and the temperature detection element may not be limited to the above described example. The Hall element 10 or the temperature detection element may be separate from the Hall IC 11, and may be arranged differently from the Hall IC 11.

(5) In the embodiments described above, the temperature detection element 16 is the diode thermometer. However, the temperature detection element 16 may not be limited to the diode thermometer.

While only the selected exemplary embodiments have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiments according to the present disclosure is provided for illustration only, and not for the purpose of limiting the disclosure as defined by the appended claims and their equivalents.

What is claimed is:

1. A position detector comprising:
   a magnetic field generation element;
   a magnetic field detection element outputting a voltage according to a change in magnetic flux density caused when the magnetic field detection element rotates relative to the magnetic field generation element;
   a temperature detection element detecting a temperature of the magnetic field generation element and outputs a voltage according to the temperature detected;
   a storage element storing a temperature characteristic formula and an output characteristic formula, wherein the temperature characteristic formula represents a relationship between a reference maximum voltage, a temperature correction value, and a correction maximum voltage, the reference maximum voltage is a maximum value of an output voltage outputted from the magnetic field detection element when the magnetic field generation element has a reference temperature, the temperature correction value is calculated based on a detection temperature detected by the temperature detection element, the correction maximum voltage is calculated by correcting the reference maximum voltage by the temperature correction value, wherein the output characteristic formula represents a relationship between a rotation angle of the magnetic field generation element relative to the magnetic field detection element, the output voltage of the magnetic field detection element, and the correction maximum voltage; and
   a rotation angle calculation element being electrically connected to the magnetic field detection element, the temperature detection element, and the storage element, the rotation angle calculation element calculating the rotation angle of the magnetic field generation element relative to the magnetic field detection element using the temperature characteristic formula and the output characteristic formula, based on the detection temperature of the temperature detection element, the output voltage of the magnetic field detection element, and the reference maximum voltage, wherein the rotation angle of the magnetic field generation element relative to the magnetic field detection element is referred to as θ, the output voltage of the magnetic field detection element when the detection temperature of the temperature detection element is t and the rotation angle is θ is referred to as VH, the correction maximum voltage when the detection temperature is t is referred to as Vt, and the output characteristic formula is expressed as $\theta = \sin^{-1}(VH/Vt)$.

2. The position detector according to claim 1, wherein, the reference maximum voltage is referred to as $V_0$, the temperature correction value is referred to as b, and the temperature characteristic formula is expressed as $Vt = V_0 \times b$, and wherein a density of magnetic flux generated by the magnetic field generation element when the magnetic field generation element is at a predetermined rotation angle and at the reference temperature is referred to as $B_0$, a density of magnetic flux generated by the magnetic field generation element when the magnetic field generation element is at the predetermined rotation angle and at the detection temperature t is referred to as $B_t$, and the temperature correction value b is expressed by $Bt/B_0$.

3. The position detector according to claim 2, wherein the temperature correction value b is expressed by $1 + \alpha \times (t-t_0) + \beta \times (t-t_0)^2$, in which α and β are constant numbers.

4. The position detector according to claim 1, wherein the reference maximum voltage is referred to as $V_0$, the temperature correction value is referred to as a, and the temperature characteristic formula is expressed as $Vt = V_0 + a$.

5. The position detector according to claim 4, wherein the reference temperature is referred to as $t_0$, and the temperature correction value a is expressed by $V_0 \times k \times (t-t_0)$, in which k is a correction coefficient.

6. The position detector according to claim 4, wherein the temperature correction value a is a constant number.

* * * * *